United States Patent [19]

Langdon, Jr. et al.

[11] Patent Number: 4,463,342

[45] Date of Patent: Jul. 31, 1984

[54] METHOD AND MEANS FOR CARRY-OVER CONTROL IN THE HIGH ORDER TO LOW ORDER PAIRWISE COMBINING OF DIGITS OF A DECODABLE SET OF RELATIVELY SHIFTED FINITE NUMBER STRINGS

[75] Inventors: Glen G. Langdon, Jr., San Jose; Jorma J. Rissanen, Los Gatos, both of Calif.

[73] Assignee: International Business Machines Corporation, Armonk, N.Y.

[21] Appl. No.: 48,318

[22] Filed: Jun. 14, 1979

[51] Int. Cl.$^3$ .............................................. H03K 13/00
[52] U.S. Cl. ............................... 340/347 DD; 235/310
[58] Field of Search ................. 340/347 DD; 235/310

[56] References Cited

U.S. PATENT DOCUMENTS 4,122,440 10/1978 Langdon et al. ............ 340/347 DD

OTHER PUBLICATIONS

Pasco "Source Coding Algorithms for Fast Data Compression" Doctoral Dissertation Stanford Univ. ©1976.
Rissanen "IBM Journal of Research and Development" May 1976, vol. 20 No. 3 pp. 198-203.
Donnan "IBM Systems Journal" vol. 13 No. 2 pp. 140-162 1974.

Langdon "IBM Technical Disclosure Bulletin" vol. 22 No. 6 Nov. 1979.

Primary Examiner—C. D. Miller
Attorney, Agent, or Firm—R. Bruce Brodie

[57] ABSTRACT

Carry-over control in strings resulting from the high to low order combining of two binary number strings is obtained through the insertion of a control character within the resultant string after detecting a run of consecutive 1's. Upon subsequent accessing and decomposition of the resultant string, the control character causes string decomposition to operate for a number of cycles in a carry correction mode. If the control character indicates that a carry has rippled through the n lesser significant positions of the resultant string, then upon decomposition, those "n" consecutive 1's are changed to 0's, and a 1 is added to the least significant position in the string preceding the control character. If the control character indicates no carry occurrence, then it is merely deleted from the string. The control of carries in this manner permits the generation of arithmetic string compression code sequences in an instantaneous FIFO pattern with only a modest reduction of compression efficiency. Relatedly, the encoder and carry suppressor is shown in FIG. 2, while the carry corrector and decoder is shown in FIG. 4.

10 Claims, 6 Drawing Figures

CARRY SUPPRESSOR AND CORRECTOR IN
ARITHMETIC CODE SYSTEM

FIG. 2  ENCODER & CARRY SUPPRESSOR DATA FLOW

FIG. 4    CORRECTOR & DECODER DATA FLOW

METHOD AND MEANS FOR CARRY-OVER CONTROL IN THE HIGH ORDER TO LOW ORDER PAIRWISE COMBINING OF DIGITS OF A DECODABLE SET OF RELATIVELY SHIFTED FINITE NUMBER STRINGS

TECHNICAL FIELD

This invention relates to the control of carries in the pairwise combining of a set of finite number strings, which are shifted relative to each other, and especially relates to improvement in the numerical representation of strings in which arithmetic encoding and decoding operations can be done instantaneously.

BACKGROUND

Arithmetic coding was introduced by Rissanen, "Generalized Kraft Inequality and Arithmetic Coding," IBM Journal of Research and Development, Volume 20, No. 3, May 1976, at pp. 198-203. Next, Langdon et al, U.S. Pat. No. 4,122,440, "Method and Means for Arithmetic String Coding," Oct. 24, 1978, taught that arithmetically encoded strings could be compressed to an efficiency approximating, within a predetermined amount, the entropy. The advance in this case relied on using only a limited amount of information from the last code word generated in order to calculate the new code word. Consequently, an encoder/decoder became physically realizable because a buffer of only a finite length was required. However, the applications were restricted because of the manner by which the code characters were generated, i.e. shifting to the "right". This resulted in a last in, first out (LIFO) decoding. LIFO decoding, while suitable for storage codes, was not suitable for point-to-point serial transmission and reception, i.e. satellite communications. Such serial transmission and reception invites a first in, first out (FIFO) decoding operation performable in near real time and permitting continuous adjustment within the receiver.

Since a number is being encoded or generated to represent symbol strings, the LIFO method and means of Langdon et al imports that the least significant bits are generated first, while the most significant bits are generated last. Consequently, decoding cannot occur until the entire codestring has been received and/or assembled. In FIFO operations, the most significant bits are generated first and hence decoding can occur without delay. One example of a FIFO string encoding is to be found in R. C. Pasco, "Source Coding Algorithms for Fast Data Compression," Doctoral Thesis, Department of Electrical Engineering, Stanford University, May 1976.

Pasco disclosed a method of arithmetic string coding in which the updating of the encoded string uses the multiplication operation performed upon operands selected according to their relative probabilities of symbol occurrence. Significantly, Pasco's use of multiplication for updating requires that for each m bit operand multiplied by an n bit operand, then m+n bits of precision must be maintained. As pointed out at page 60 of his thesis, Pasco encoded each new value to the right of the already decoded string. Although FIFO decoding is possible, it requires the processing of the entire string prior to transmission and/or storage. It mitigates against transmission and near real time decoding as the string is generated. The reason for this is that there is no control of "carries."

The arithmetic encoding process can be viewed as the summation of properly shifted numbers as may be found, for example, in the process of ordinary multiplication. Individual summands are termed augends and the displacements in digits between adjacent augends are called shift amounts. In this regard, see Langdon et al and Rissanen and Langdon, "Arithmetic Coding," IBM Journal of Research and Development, Volume 23, No. 2, pp. 149-162, March 1979. In ordinary multiplication, some augends may be 0, as in arithmetic coding, but the shift amount is always 1. Also, in ordinary multiplication, as in LIFO type arithmetic codes, each augend is added to the sum of the previous right-most augend. In ordinary multiplication, this is called partial product. For arithmetic coding purposes, it is termed a partial sum. Once bit positions have exited the arithmetic part of the summation operation, they are never changed. In LIFO arithmetic codes, the summation begins at the least significant augend, whereas for the FIFO codes, the summation begins with the most significant augend. For FIFO codes, the carry-over presents a problem in generating the partial sums beginning with the most significant augend because bit positions which have already undergone the summation process are still subject to being "one-upped" due to the propagation of a carry. The carry-over problem is mentioned in Rissanen and Langdon, but is not treated there. In Pasco, the higher order part of the codestring was retained so any carry could be propagated as far as necessary.

THE INVENTION

It is accordingly an object of this invention to devise a method and means for controlling the propagation of carries upon pairwise combining of a set of shifted (binary) numbers in high order to low order fashion. In this order, the left-most shifted numbers are added first, and the right-most last. It is a related object to encode and decode a near instantaneous FIFO arithmetic code for compression purposes in either storage or transmission. It is yet another object to devise a method and means in length oriented arithmetic codes to utilize buffers of modest size to hold the encoded portions of the string prior to their transmission and until no future carry-overs can take place.

The above objects are satisfied in a machine implementable method and means for carry-over control in a resultant string formed by the high to low order pairwise combining of a set of shifted binary number strings. The resultant string is selectively transmitted or stored and, upon being accessed, the resultant is decomposed into the original pair of binary number strings. The method steps comprise detecting n consecutive characters of a first kind (1's) in the resultant; inserting a control character in front of the sequence, which increases the resultant string length by the length of the control character. Upon subsequent accessing of the resultant string, the control character causes the string decomposition to operate in carry corrector mode. More particularly, the control character values are of a first (1) and a second (0) kind. This is indicative, respectively, of a carry or no-carry occurrence rippling through the n+1 positions of the resultant string. If the control character is a 1, then the n consecutive 1's are changed to 0 and a 1 is added to the least significant position in the resultant string to the left of the deleted control character. If the control character is a 0, it is merely deleted from said string.

The inserting of a unique character in a serial sequence for control purposes was described by Donnan and Kersey, "Synchronous Data Link Control: A Perspective," IBM Systems Journal, Volume 13, No. 2, pp. 140–162, published 1974. This reference depicts a communications protocol for a variable length serial message on a data link. The protocol includes a flag defined as a unique bit sequence, not to be found in a transmission in any other way other than as a frame delimiter. In Donnan, a serial bit stream source generating j 1's would insert a 0 after the jth 1. The counterpart receiver, upon counting j 1's would examine the next bit. If 0, it would delete. If 1, it would treat it as a flag. However, in the instant invention as applied to numerical codestrings, a control character performs two functions. First, it limits the maximum number of consecutive digits through which a carry can be rippled. This is a parametric and is not a property of the number string per se. Second, the control character value invokes decoder action, rather than encoder only management as, for instance, in Langdon et al and Pasco.

DESCRIPTION OF THE BEST MODE AND INDUSTRIAL APPLICABILITY

In the encoder/decoder system which illustrates this invention, the encoder will generate code words for which an integer length l(k) corresponds to each source symbol k. These lengths could be determined by Huffman's algorithm and the given code would have the same mean code length as a Huffman code with the same lengths. An advantage of this code is, however, that the code words need not be tabulated. The resulting code words, called "augends", are added together rather than concatenated in order to form codestrings. Relatively, decoding is based upon magnitude comparison.

Figure 1:
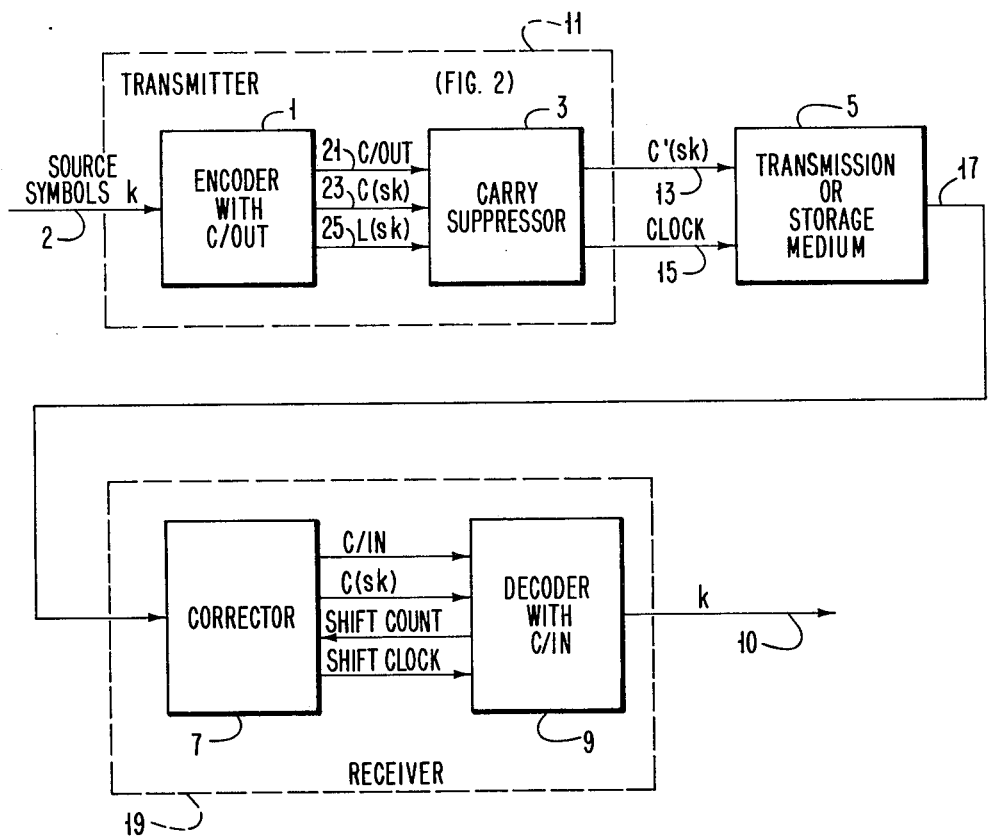
FIG. 1 is a system data flow diagram depicting a carry suppressor and corrector.

Referring now to FIG. 1, there is shown an arithmetic code system comprising a transmitter 11, a receiver 19 coupled thereto over a transmission or storage medium 5 and a path 17. Source symbols k are applied to the transmitter over an input path 2. Responsive to each symbol an encoder 1 generates a pair of binary numbers L(sk), C(sk) over a pair of respective paths 25, 23 to a carry suppressor 3. The carry suppressor ascertains the presence of n consecutive 1's in the codestring and upon the 1 or 0 condition of the next string bit position inserts a control character in the (n+1)st bit position. To best illustrate the adverse effects of carry propagation and its resolution according to this invention the discussion is directed next to coding operations.

The code representation of the symbol strings $s = s_1 s_2 s_3 \ldots s_m$ of symbols $s_i$ is generated as a binary fractional number. The code may be generated recursively depending upon whether the string is to be read from left to right or in the right to left direction. Decoding can be arranged so that $s_1$ is decoded first, $s_2$ is decoded next, etc. The FIFO arithmetic encoding method generates a codestring to the right according to the following recursions:

---
Instantaneous FIFO Arithmetic Code Recursions augend $A(0) = 0$ $$A(k) = \sum_{i=0}^{k-1} 2^{-l(i)} = A(k-1) + 2^{-l(k-1)}$$

string length $L(sk) = L(s) + l(k)$
codestring $C(sk) = C(s) + A(k)2^{-L(s)}$
$C(k) = A(k); L(k) = l(k)$
$l(k) = \log(1/p(k)) + E$
$= $ integer subject to the Kraft inequality $\sum_{k=0}^{m-1} 2^{-l(k)} \leq 1$

--- sk denotes the string obtained by concatenating the old string s with the next symbol k to its right. This permits the partial codestrings $C(s_1), C(s_1 s_2), C(s_1 s_2 s_3) \ldots$ to be transmitted and decoded before the entire string $C(s_1 s_2 s_3 \ldots s_m)$ has been formed. This result obtains provided that the propagation of the carry-over bit resulting from the addition within the recursions has been presented.

The decoding begins with the left-most symbol of s. This symbol is decoded as the largest symbol k for which $C(s) > A(k)$. Once symbol k is found so that $s = ks'$ for some string s prime, the decoding continues according to the recursion $C(s') = 2^{l(k)}[C(s) - A(k)]$.

The coding operations consist of a shift and an addition. Further insight into the nature of FIFO arithmetic encoding and decoding can be gained by the following illustrations. In this regard, the first illustration exemplifies the FIFO arithmetic encoding process while the second illustration shows the adverse affects of carry overflow.

EXAMPLE 1

Given alphabet {k} and lengths l(k), encode symbol sequence 1,2,1,3

| k | l(k) | Augend Computation |
|---|------|--------------------|
| 0 | 1 | $A(0) = 0$ by definition |
| 1 | 2 | $A(1) = A(0) + 2^{l(1)} = 0 + 2^{-1} = 0.1$ |
| 2 | 3 | $A(2) = A(1) + 2^{-l(1)} = 0.1 + 2^{-2}$ |
|   |   | $= 0.1 + .01 = .11$ |
| 3 | 3 | $A(3) = A(2) + 2^{-l(2)} = 0.11 + 2^{-3}$ |
|   |   | $= 0.11 + .001 = 0.111$ |

Encode symbol sequence 1,2,1,3

$C(1) = A(1) = 0.10$
$L(1) = l(1) = 2$
$C(12) = C(1) + A(2)2^{-L(1)} = 0.10 + .11[2^{-2}]$
$\quad = 0.10 + .0011 = .1011$
$L(12) = L(1) + l(2) = 2 + 3 = 5$
$C(121) = C(12) + A(1)2^{-L(12)} = .1011 + 0.1[2^{-5}]$
$\quad = .101101$
$L(121) = L(12) + l(1) = 5 + 2 = 7$
$C(1213) = C(121) + A(3)2^{-L(121)} = .101101 + 0.111[2^{-7}]$
$\quad = .1011010111$

---

In Example 1, the augend computation is included to show the manner of its calculation. It is also clear in this example, that the addition of the r-bits A(k) to the r-bits of C(sk) does not result in a carry. To show this effect, the length attributes l(k) of alphabet [k] are modified in the next example.

EXAMPLE 2

| Given an alphabet {k} and the lengths l(k) | | |
|---|---|---|
| k | l(k) | Augend Computation |
| 0 | 3 | $A(0) = 0$ by definition |
| 1 | 1 | $A(1) = A(0) + 2^{-l(0)} = 0 + 2^{-3} = .001$ |
| 2 | 2 | $A(2) = A(1) + 2^{-l(1)} = .001 + 2^{-1}$ |
|   |   | $= .001 + .1 = .101$ |
| 3 | 3 | $A(3) = A(2) + 2^{-l(2)} = .101 + 2^{-2}$ |
|   |   | $= .101 + .010 = .111$ |

Encode symbol sequence 1,2,1,3

$C(1) = A(1) = .001$
$L(1) = l(1) = 1$
$C(12) = C(1) + A(2)2^{-L(1)} = .001 + .101[2^{-1}]$
$= .001 + .0101 = .0111$
$L(12) = L(10) + l(2) = 1 + 2 = 3$
$C(121) = C(12) + A(1)2^{-L(12)} = .0111 + 001[2^{-3}]$
$= .0111 + .000001 = .011101$
$L(121) = L(12) + l(1) = 3 + 1 = 4$
$C(1213) = C(121) + A(3)2^{-L(121)} = .011101 + .111[2^{-4}]$
$= .1000001$

As the augends are added to the right end of the previously generated string, the carry-over bit propagates to the left and causes alteration of a large number of bits in the previously generated codestring. In Example 2, the carry-over bit in the last addition has propagated all the way to the left and has caused the change of all the bits of C(121) which were more significant than the augend bits. This carry-over problem is prevalent in all FIFO arithmetic codes.

When the codestring C(sk) is being left-shifted, the r-bit augend in the least significant part of the codestring is undergoing arithmetic modification. If the next most significant part of the codestring i.e. to the left of where the augend is added consists of a consecutive substring of 1's, then a carry-over problem can arise. Thus, execution of the lower order part of the codestring, where the augend is being added in, can carry propagate through a substring of consecutive 1's, converting them to 0's until the carry propagates into the first 0 encountered. This 0 will be converted to a 1 and terminate the propagation.

It should be noted that for r-bit augends A(k), only r-bits of the codestring can ever undergo an arithmetic sum operation for symbol k. Bits to the left of these r "arithmetic" bits can at most be involved in a carry propagation.

It was unexpectedly observed that advantage could be taken of the following property of arithmetic codes $C(ss') = C(s) + 2^{-L(s)}C(s') < C(s) + 2^{-L(s)}$. In this relation, s' denotes any continuation string of s. The arithmetic codestring is a sum of properly shifted augends. The following is defined as the arithmetic decodability property: for any given nonzero augend, the sum of all the augends to the right (lower order augends) cannot exceed the value of the given augend. This property is necessary for decodability. This property also means that once a carry propagates to the left beyond the augend being summed, no second carry will propagate over the same bits. Augends which are properly shifted have this property.

Now, suppose that the augends are added to the tail of the previous string in an r-bit arithmetic register. It follows that the last "1" in the first L(s) bits of c(sk) can never again be flipped into a 0 by any future carry-over bits. Further, once "0" has been shifted left out of this register, it can be converted to a "1" by at most 1 carry-over propagation. Consequently, any bit which has been transferred out of the arithmetic register can experience at most 1 carry in.

Referring again to FIG. 1, assume the encoder operates on the lowest order r-bits of the codestring C(sk) shifting and adding. The encoder output is sent to a carry suppressor 3. As its name implies, the function of the suppressor 3 is to suppress the ripple carry in. The so modified codestring C'(sk) is applied to the transmission or storage medium 5. When the string is accessed by the receiver 19 over path 17, it is first processed by a corrector 7.

Suppressor 3 upon detecting a substring of n consecutive 1's in C(sk) increases the codestring length by at least one character position and inserts a control character "0" therein. As a result, the control character blocks propagation of a carry 1 beyond this position. At most a carry may propagate into this position and convert the 0 to an "1".

At the receiver, the dual of the suppressor i.e. corrector 7, receives a substring of n consecutive 1's and tests the (n+1)st bit. If this bit is a "1" a carry-over occurred in that position. As a result the carry rippled up through the consecutive 1's. These 1's are changed to 0's and a 1 is added to the least significant position in the r-bits increment in the string. If the control character indicates no-carry i.e. is a 0, then it is merely deleted from the string.

Figure 2:
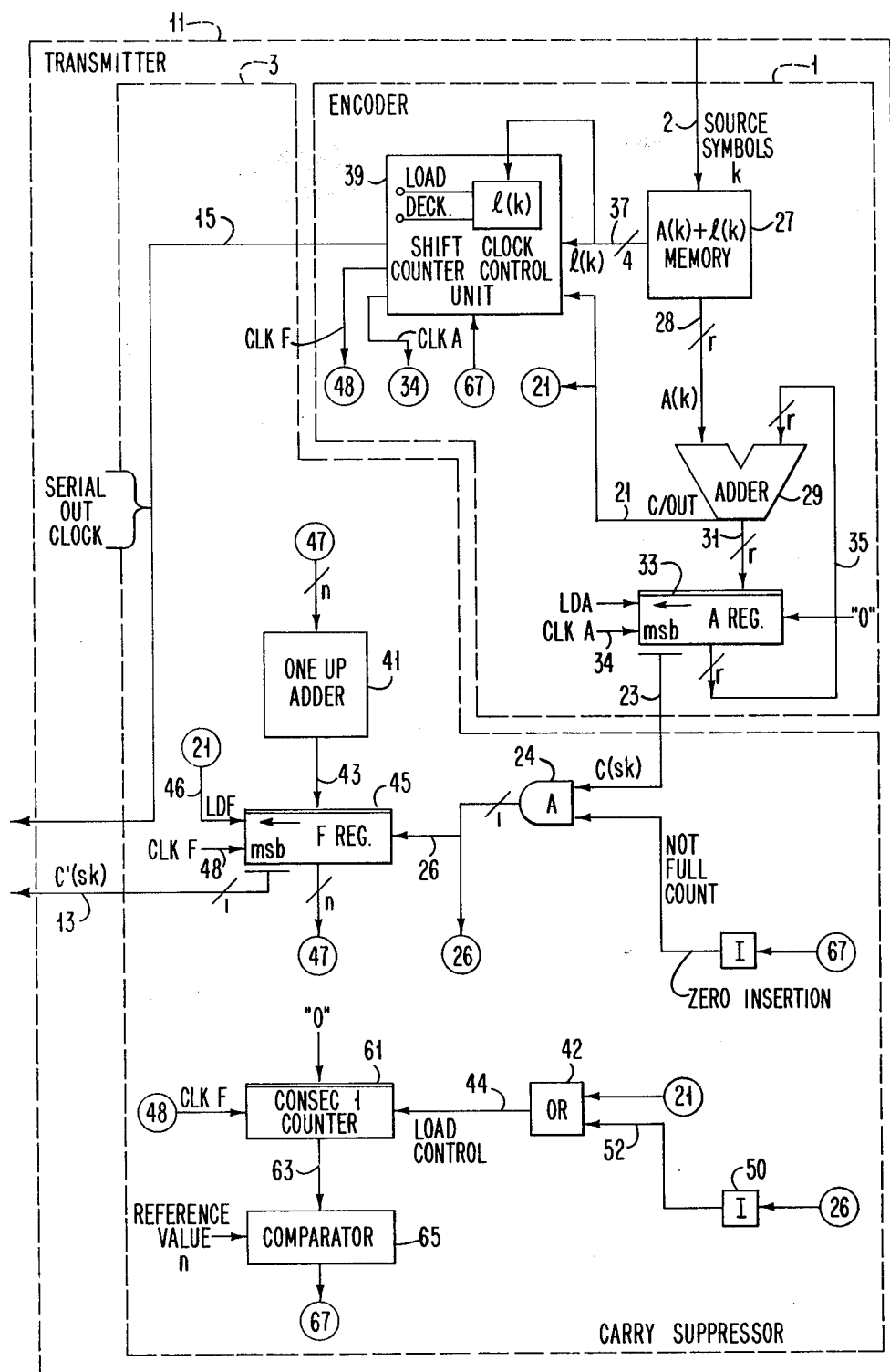
FIG. 2 shows an encoder and carry suppressor data flow of the transmitter portion of FIG. 1.
Figure 3:
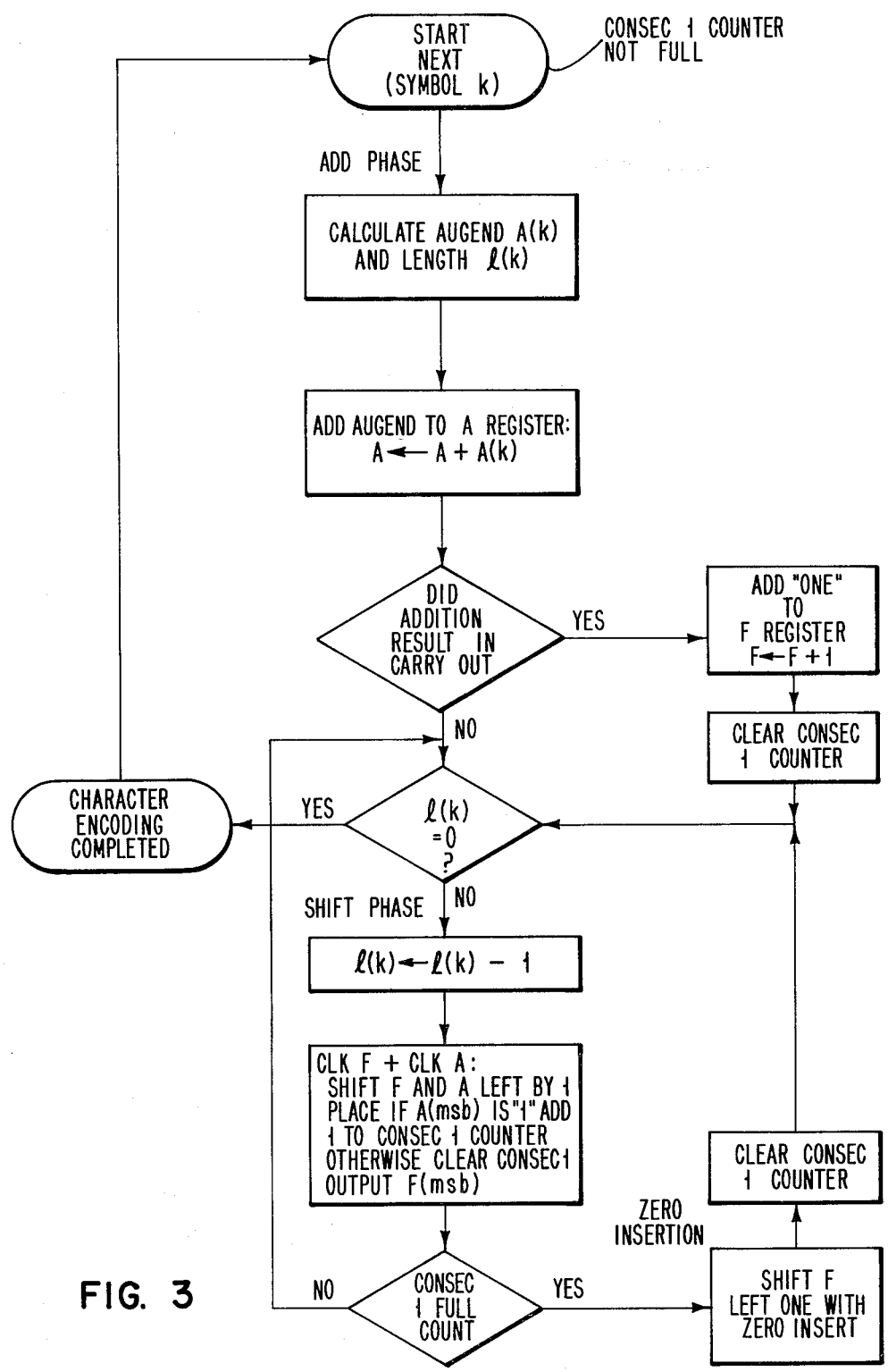
FIG. 3 depicts a functional two-phase show diagram of the encoder and suppressor of FIG. 2.

Referring now to FIG. 2 when taken together with FIG. 3, there is shown the encoder and carry suppressor data flow of the transmitter portion 11 of FIG. 1. In FIG. 2, an encoder for an integer length FIFO arithmetic code (introduced in Rissanen and Langdon) is used because the integer length case is relatively simple. The augend A(k) is simply $$\sum_{j=0}^{k-1} 2^{-l(j)}.$$

In FIG. 2 the augends are precalculated and stored in memory 27. The encoder includes a memory 27 accessed by source symbol k over path 2. The contents of each memory location consist of an r-bit augend A(k) and a 4-bit length attribute l(k). The encoder further includes a shift clock counter unit 39 responsive to the l(k) operand from memory 27 over path 37, and r-bit A register 33, and an adder 29 for arithmetically combining the r-bit augend A(k) from memory 27 via path 28 and the r-bit contents of the A register 33 applied over feedback path 35. The A register can be left-shifted or parallel loaded.

The carry suppressor 3 includes left-shifting F register 45 with parallel load capability serially coupled to the most significant bit position (msb) of the encoder A register over a gated path 23, 24, and 26. The suppressor further includes the mechanism necessary to detect a run of consecutive 1's with means for appropriately modifying the arithmetic string in the F register when the number of runs is equal to a predetermined value. The mechanism includes a counter 61, a comparator 65, and the attendant register and counter clocking and load controls 46, 48, 42.

The code sequence C(sk) in encoder 1 is generated by add and shift operations. As is apparent from Examples 1 and 2, each augend A(k) was right-shifted with respect to the codestring C(s) by an amount represented by $2^{-L(s)}$. This may be alternatively stated as codestring C(s) being shifted to the left of A(k) by the same number of positions. Thus, the contents of A register represent the most recently encoded portion of the codestring C(sk) and the least significant positionally in the string.

Encoding consists of a two-phase operation, namely, an add phase and a shift phase. The add phase treats the arithmetic combining of a newly accessed augend with the A register contents, testing for any resulting carry and modifying the next most significant string byte (located in the F register).

The shift phase is a reiterative operation in which the contents of the F register and A register are left-shifted 1 bit per cycle, until l(k) shifts have taken place. The value "0" is shifted into the vacated position of the A register. The number of shifts is governed by the magnitude of l(k) decremented once each cycle. When the value of l(k) is 0 the character coding encoding is completed. Also during the shift phase, the arithmetic string is modified to the extent that a 0 is inserted if the number of consecutive 1's exceeds a predetermined number n.

Assuming that a character encoding has been completed, the add phase of the next encoding cycle starts with the application of a symbol k on path 2 for the purpose of accessing memory 27. Both the length attribute l(k) and the augend A(k) are respectively applied to the shift counter unit 39 and is a first input to adder 29. During the add phase, the contents of A register 33 are the unshifted out portion of the combined augend in the A register involved in the previous character encoding cycle. The r-bits of the A register are applied to adder 29 as a second input over path 35 where they are added. The resultant is over-written into the A register (by parallel load) through path 31. If the augend addition resulted in a carry out, the carry would be in the form of a signal applied on path 21 to counter unit 39. As a consequence of the presence of a carry on path 21 two actions occur. First, a binary 1 is added to the least significant digit position of the F register. Second, the contents of the consecutive run counter 61 is cleared i.e. set to 0. After the encoder response to the carry has been completed, the shift phase is then entered into. It should be noted, that the clock counter unit 39 includes the usual decrementing circuitry (not shown) designed such that upon a decrementable register being loaded with an initial value of l(k), a signal for example on path 15 generated by the control unit would be used by any utilization circuit such as a transmission or a storage medium 5 to gate in the signal contents on path 13. Following the adder phase, if a carry-out occurred, it must be propagated to the F register 45. This is done by loading F with the value on path 43, the value of F plus 1 out of one up adder 41. Carry-out signal 21 causes the loading of F. At the same time, counter CONSEC is loaded with a "0" through OR gate 42.

In starting the shift phase, the contents of the counter l(k) are decremented. Concurrently, the contents of F register and A register are each left-shifted by one position through the action of clocking signals on paths 48 and 34, respectively. If the contents of the most significant bit position of the A register is a 1 then the contents of counter 61 is incremented by +1, (otherwise, the counter is reset). Counter 61 is incremented by signal 48 CLK F. If A(msb) is "0", then a "1" is applied to path 52, through OR gate 42 to path 44 which causes the CONSEC counter to be loaded with "0" (reset) instead of incremented.

A comparator 65 continuously monitors the contents of counter 61. If the counter value is less than the reference value n and the clock counter unit has not been decremented to 0 then another cycle of the shift phase is invoked. If on the other hand, the counter 61 contents equal n, a "0" insertion in the least significant bit position of the F register is accomplished by placing a 1 on path 67 from comparator 65. This will serve to disable AND gate 24, signal counter unit 39 and cause a left shift by one position of the contents of F register. Such a 0 insertion does not necessarily complete the cycle of the shift phase. Any further recycling being governed by whether the l(k) counter has been decremented to 0.

Figure 4:
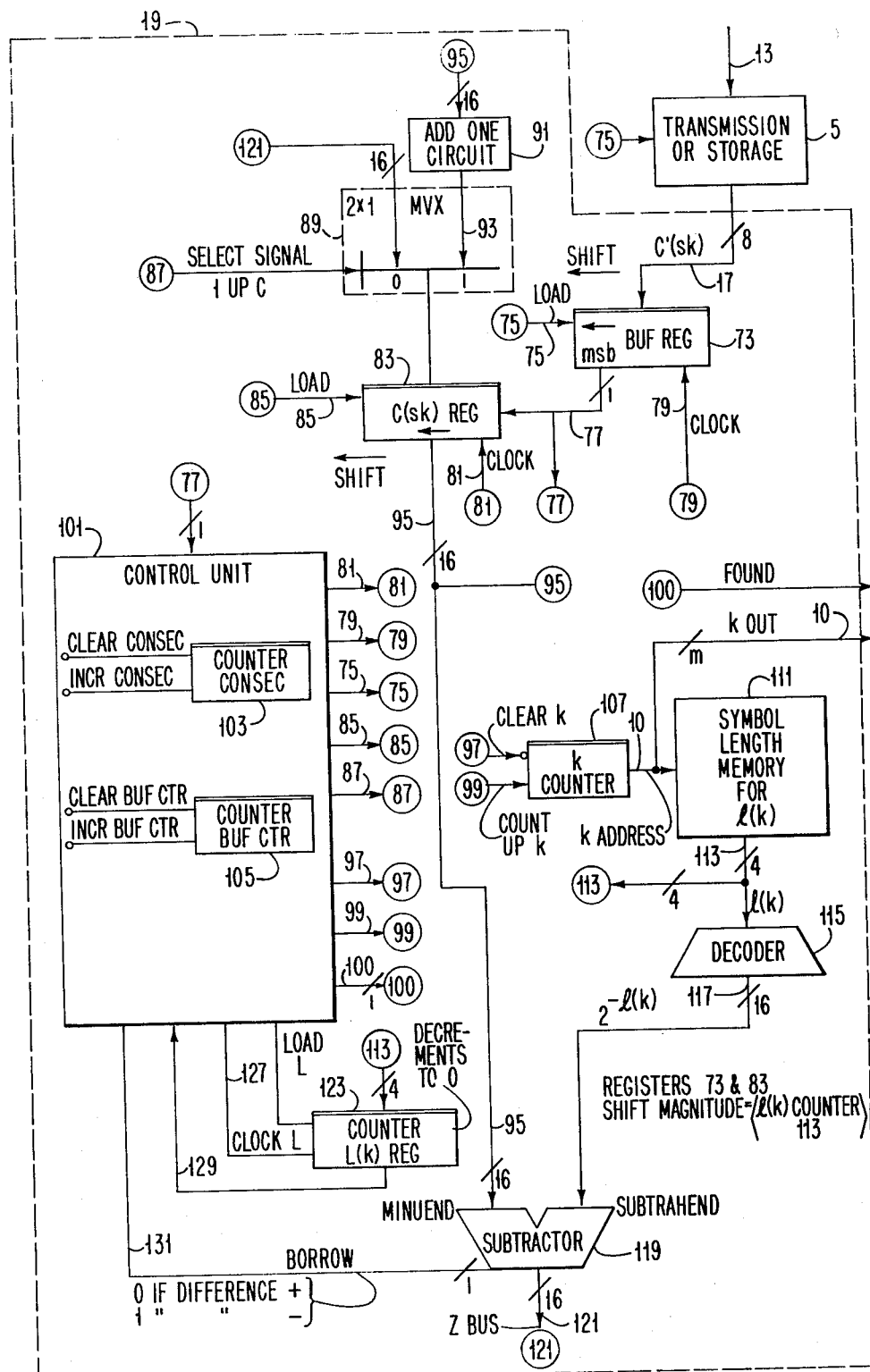
FIG. 4 illustrates the corrector and decoder data flow of the receiver portion of FIG. 1.

Referring now to FIG. 4, there is shown the corrector and decoder data flow of the receiver portion 19 of FIG. 1. Byte oriented sequences of the codestring C'(sk) are accessed from the transmission or storage medium 5 over bytewide path 17. Each byte's worth of C'(sk) is applied to BUF register 73 and loaded under control of a signal applied from the receiver control unit 101 to the register 73 over path 75. Register 73 is a serializer with the parallel loaded bits of each byte being left-shifted under clock control 79. The left shifted bits are exited through the most significant bit position (msb) to the C register 83 coupled by way of path 77.

To illustrate the action at the decoder, an integer length arithmetic code is also used. However, this time the augends are not precalculated and stored; now only the lengths l(k) need be stored. To decode a properly adjusted codestring C, we need to find the largest value k which leaves C-A(k) positive. Since A(k) is $$\sum_{j=0}^{k-1} 2^{-l(j)};$$

we can instead successively subtract $2^{-l(j)}$, j=0, 1, etc. from (updated) C until the result goes negative. The value of j when the result goes negative (detected by a valid Borrow-out signal from the subtractor) is the decoded source symbol. We note that this process is also possible to implement at the encoder; namely the values $2^{-l(j)}$, j=0, 1, . . . , (k-1) can be successively added to the codestring C(s) to form C(sk). This saves storing the values A(k).

Decoding takes the resultant string C(sk) and decomposes it into two numbers in a dual manner to the encoding (combining) of an augend and an overlapping portion of the resultant string. In this regard, the decomposing is performed by subtractor 119. The decode phase operates according to the recursions $C(s)=C(s)-2^{-l(k)}$, k=k+1.

Figure 5:
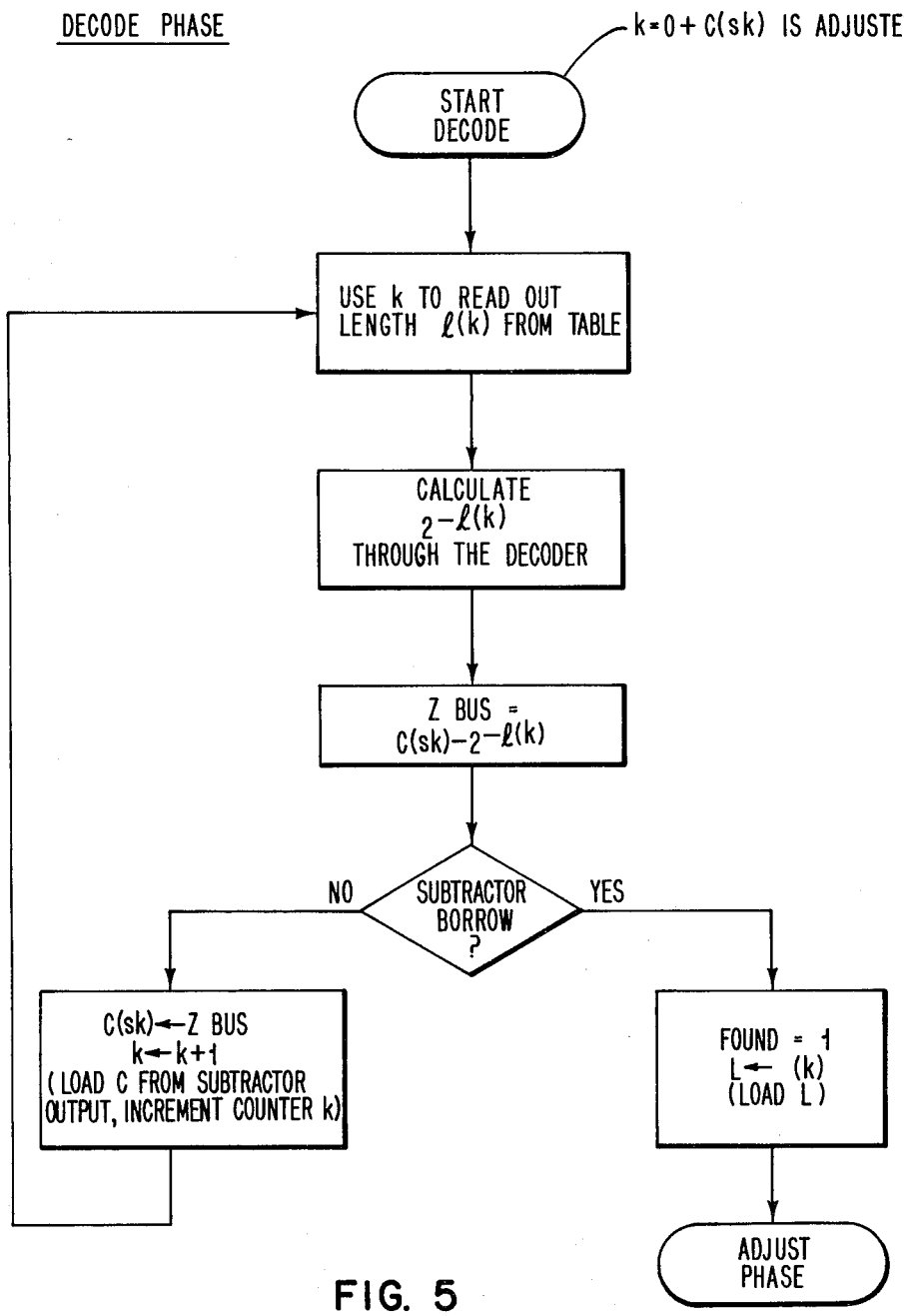
FIGS. 5 and 6 exhibit a two-phase functional flow diagram of the corrector and decoder of FIG. 4.
Figure 6:
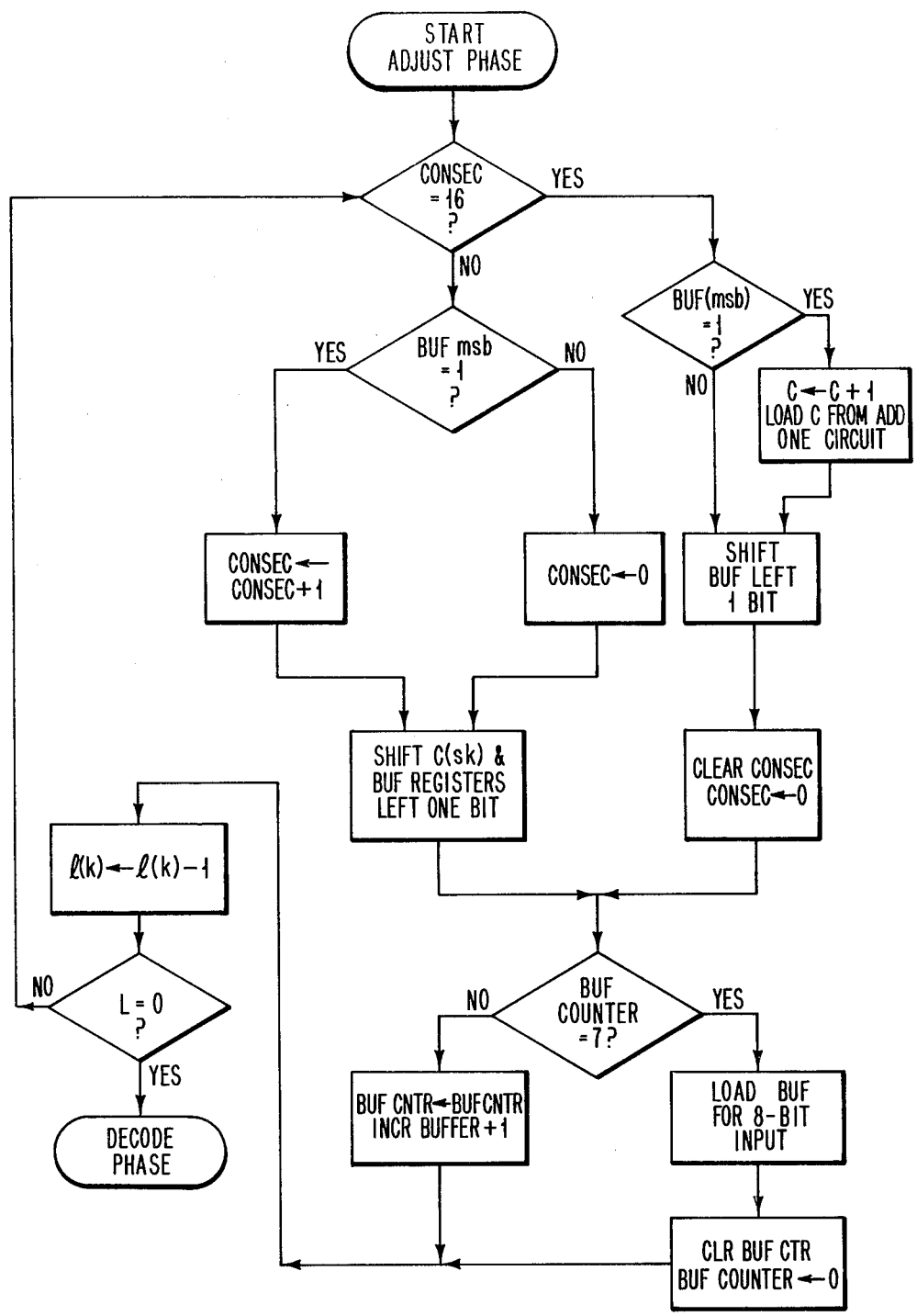

Referring now to FIGS. 5 and 6 when taken together with FIG. 4, the decoder operation can best be understood as consisting of two operable phases. These are respectively denominated the decode and adjust phases. The decode phase decomposes a combined string C(sk) into a symbol string and a length string. The adjust phase is invoked following the decoding of the source character and is responsive to the detection of n consecutive 1's in the arithmetic codestring and the value of the control character in the $(n+1)^{st}$ bit position. As mentioned in connection with the encoding operation, the decoding described in this embodiment concerns an integer length arithmetic code. This means that each source symbol k has a length attribute l(k) consisting of a real positive integer value.

The decode phase assumes that the codestring C(sk) is adjusted. Please note that the notation C'(sk) refers to a arithmetic codestring into which control characters may have been inserted at the encoder.

The relevant (higher Order) portions of the codestring are held in the registers C83 and BUF 73. These are left-shifting registers which also possess a parallel load capability.

At the start of decoding, the contents of counter 107 k are "0", access memory 111 in order to obtain the shift length l(k) operand consisting of 4 bits. The accessed shift length is the length attribute of symbol k. l(k) is concurrently applied over path 113 and loaded into register 123 and decoder 115. The output of decoder 115, $2^{-l(k)}$, is applied via path 117 as the subtrahend input to subtractor 119. The minuend input to the subtractor is obtained via path 95 from C register 83. Register 83 contains the two most significant byte of string C(sk). The difference output from the subtractor provides a feedback path 121 through the 2X1 MUX back to C register 83. Control of MUX 89 is by way of a select signal on path 87 from control unit 101. When the signal is 0, the path 121 parallel loads 2 bytes from subtractor 119 into register 83. When the signal is 1, then the add-one circuit 91 is coupled to said register and C register receives C(s)+1. Lastly, subtraction is reiterated until a borrow signal on path 131 changes from 0 to 1. This change coincides with the value on the Z bus going negative. These transitions define the point in time where the contents of counter 107 is treated as the decoded symbol k.

When a decode cycle begins k counter 107 is set to 0 by a clear signal on path 97 from control unit 101. If $C(sk) > 2^{-l(k)}$ i.e. borrow signal 131 is 0, then the k counter is incremented k←K+1 over path 99, also from the control unit.

At the conclusion of the decode phase, the decoder/receiver 19 enters into the adjust phase. In the adjust phase, when C(sk) is shifted left, the arithmetic codestring is concurrently scanned for the presence of a predetermined number n of consecutive 1's therein and examines the n+1st bit position in order to ascertain the control character value inserted by the suppressor 3. If the character value is 1 then a 1 is added to the least significant bit position of the C register 83 contents. If the control value is 0, it is merely deleted from the string.

This protocol is implemented in the decoder in the following manner. First, the adjust phase consists of l(k) recurrent shift-left cycles. This is controlled by register 123 in which the value l(k) is inserted at the beginning of the character decode phase. Each cycle trip time results in the register 123 being decremented by 1 with the phase terminating when the register is decremented to 0.

The scanning of the arithmetic codestring consists of testing the bit value in the most significant bit position of buffer register 73. If the value is 1, then counter 103 dedicated to tracking the number of consecutive 1's in the codestring is incremented by 1 by activating signal INCRCONSEC. If the value is 0, then counter 103 is reset to 0 by activating signal CLEARCONSEC. After the bit value is tested, the entire register contents of registers 83 and 73 are shifted left by 1 bit position. Counter 105 is used to track the number of empty bit positions in BUF register 73. After the register contents of registers 83 and 73 have been left-shifted, counter 105 is tested and if it is not equal to 7, then it is incremented by +1 by activating signal INCRBUFCTR. If indeed counter 105 is equal to 7, then register 73 is considered empty and the next lower order byte's worth of codestring C'(sk) is inputted from transmission or storage element 5 over path 17. When this occurs, counter 105 is set to 0 by activating signal CLEARBUFCTR. At the point where CONSEC register 103 indicates that 16 consecutive 1's have been detected at the most significant bit position of register 73, then the value of the next bit is the value of the control character inserted by carry suppressor 3 at the transmitter. If the bit value in the most significant bit position of register 73 is a 1, then control unit 101 causes the MUX 89 to gate through output from the add 1 circuit 91 at the clock transition on path 81. This has the effect of adding a 1 to the least significant bit position of the two bytes in register 83. Next, the contents of register 73 are left-shifted 1 bit position and counter 103 is reset to 0. Both the left-shift register 83 and the reset to 0 of counter 103 occur when the most significant bit value is tested in register 73 is 0.

Since the invention resides in the method and means for carry propagation in the high to low order combining and decomposing of a set of properly shifted binary number strings, the details of the control unit 101 logic design has been omitted. Control unit 101 is a sequential machine and is completely specified by the recitation of its input and output. Reference should be made to Montgomery Phister, "Logical Design for Digital Computers", 1958, Chapter VI, at pp. 143–173, for a disquisition on sequential machine realization. It is considered sufficient for implementation purposes to note that the control unit inputs consist of the value at the most significant bit position in register 73 over path 77, the borrow signal from subtracter 119 over path 31 and the decrement to 0 signal register 123 over path 129. Thus, responsive to the BUF counter equal 7 in the decoder adjust phase, a signal on path 75 causes the next byte to be transferred from storage element 5 to BUF register 73. Also, when n+1 consecutive 1's have been detected via path 77 by the control unit, a signal on path 87 to MUX89 results in the add 1 circuit being directly coupled therethrough to register 83. Relatedly, actuation of the select signal on path 87 also requires a load control signal on path 85 so that the register 83 may be appropriately parallel loaded.

The method and means of this invention have been embodied in a arithmetic encoding/decoding system for compression purposes. It is clear, the suppressor 3 inserts an extra bit into the codestring upon the detection of n consecutive 1's following the operation of adder 29 in FIG. 2. Since the probability of occurrence of n consecutive 1's in the F register (register 45) is approximately $2^{-n}$, the reduction in the compression ratio is insignificant for n greater than 6.

It is to be understood that the particular embodiment of the invention described above and shown in the drawings is merely illustrative and not restrictive on the broad invention. For example, the invention should be of utility in respect of all number strings arithmetically combined in high to low order for carry control purposes. Clearly various changes in design, structure, and arrangement may be made without departure from the spirit of the broader aspects of the invention as defined in the attendant claims.

What is claimed is:

1. A method for carry-over control in the encoding, selective transmitting (11) or storage, decoding, of a resultant number string C(sk) recursively formed by the high to low order combining $(C(s)+A(k)2^{-L(s)})$ of a pair of number strings, C(s), A(k), the resultant string being selectively transmitted or stored (5), and upon being accessed (19), the resultant string being recursively high to low order decomposed $C(s)=2^{l(k)}$ into the original pair of number strings, C(s), A(k), the method steps subsequent to each recursive string formation interval being executable upon an apparatus including a memory for temporarily storing segments of the resultant string whose segment length is less than the resultant string length, the method steps comprising:

detecting (61, 65, 67) n consecutive characters of a first kind in the resultant string C(sk);

increasing the resultant string length (67, 24) by at least one position and inserting (41, 45) a control character therein responsive to the detection of n characters to form a modified resultant string C' (sk); and upon subsequent accessing (FIG. 4) of the modified resultant string C' (sk) and detection (73 msb, 77, 101) of n consecutive characters of the first kind, utilizing the control character value to operate the string decomposition in a carry correction manner (87, 89, 91, 83).

2. A method according to claim 1, wherein the control character values are of a first (1) and a second (0) kind indicative respectively of a carry or no-carry occurrence rippling through the n+1st most significant digit position of the resultant string, the method steps invoked upon the resultant string being decomposed further comprise;

changing the n detected consecutive characters of the first kind to characters of the second kind, and adding (91) a character of the first kind to the least significant position in the portion of the resultant number string (83) being decomposed, if the control character is of the first kind; and deleting (73 msb, 77) the control character from the resultant string to be decomposed, if the control character is of the second kind.

3. An apparatus for carry-over control in combination with an encoder (11,1) for recursively generating a combined number string in high to low order (C(sk)) from the pairwise addition of a set of properly shifted number strings (C(s), A(k)) which satisfy the arithmetic decodability property; and a decoder (19,9) for recursively decomposing said combined string in high to low order into the original pair of binary number strings (C(s),A(k)); said apparatus comprising:

at the encoder;

means (3, 26, 50, 42, 61, 65, 67) for detecting the presence of n consecutive characters of a first kind in the resultant string (c(sk)) after each recursive string formation interval;

means (67, 24, 41, 45) responsive to the detection of n characters of the first kind for increasing the combined string length by at least one position and for inserting a control character therein;

at the decoder;

means (103, 73 msb, 77, 101) for detecting n consecutive characters of the first kind in a received combined string; and means (87, 89, 91, 83) responsive to the detection of n characters for utilizing the control character value in order to operate the combined string decomposition in an overflow manner.

4. An apparatus according to claim 3, wherein the control character values are of a first and second kind indicative respectively of a carry or no-carry occurrence rippling through the n+1st most significant digit position of the combined string, the decoder further comprises:

means (91) for changing the n detected consecutive characters of the first kind to characters of the second kind, and adding a character of the first kind to the least significant position in the instantaneous portion of the combined number string being decomposed (83) upon the condition that the control character is of the first kind; and means (73 msb, 77) for deleting the control character from the combined string to be decomposed, if the control character is of the second kind.

5. An apparatus according to claim 4 wherein the character values of a first and second kind are respectively 1 and 0.

6. An apparatus for generating an instantaneous FIFO arithmetic codestring element C(k) in a codestring C(sk) responsive to each symbol k in a string s of symbols comprising:

shift register means (45, 33) for storing the n+r lowest order bits of codestring C(s);

means (27) responsive to each applied symbol k for obtaining an r-bit augend A(k) and an integer valued length attribute l(k);

means (29) for arithmetically combining the augend with the contents of the r lowest order bits in the shift register means, for generating a carry (21), and for left shifting the register contents l(k) positions (39, 34, 48, 24, 26);

means (21, 39, 41) responsive to carry signal of a first kind and prior to left shifting for incrementing the n highest order bits in the register; and means (61, 65, 67, 24) for ascertaining the presence of n consecutive bits of a first kind in the left shifted codestring in the register, for increasing the codestring length by at least 1 bit position and for inserting a control character of a first kind in said position if the nearest most significant bit to the n consecutive bits is of a first value and for inserting a control character of the second kind if said nearest most significant bit is of a second value.

7. An apparatus according to claim 6, wherein the n consecutive bits of a first kind assume the binary value of 1, wherein the first and second values for the nearest most significant bit to the n consecutive bits are respectively binary 1 and 0, the carry signal of a first kind assumes the binary value of 1.

8. An apparatus according to claim 6, wherein the means for ascertaining the presence of n consecutive bits of the first kind includes a counter (61); a comparator (65) for generating a first signal whenever the counter contents equal a reference value n; and a control arrangement (42, 50, 39) for incrementing the counter for each consecutive bit of a first kind detected in the left-shifted codestring and for resetting the counter to 0 upon detecting a consecutive bit of the second kind.

9. An apparatus for generating a symbol k in a string s of symbols responsive to each codestring element C(k) in an instantaneous FIFO arithmetic codestring C' (sk), said codestring being modified to include control characters having either a first or second value and inserted in the string after a sequence of consecutive bits of a first kind; the apparatus comprises:

a control unit (101) for regulating the data pathing of the codestring decomposition;

a memory (111) for storing integer valued length attributes l(k);

means (107, 113, 115) including first counter means (107) for cyclically accessing said memory in order to obtain l(k) as a function of the first counter contents k and for forming a value $2^{-l(k)}$;

shift register means (83, 73) for storing the n+r ordered bits of the codestring C' (sk);

means (119) including the control unit (101) for obtaining a difference (121) and borrow (131) signals between the n highest order bits in the shift register (83) and the value $2^{-l(k)}$, said means further including: means responsive to the borrow signal assuming a first value indicative of C' (sk)$>2^{-l(k)}$ for incrementing the first counter means by a predetermined amount e, for accessing the memory to obtain l(k+e), for forming $2^{-l(k+e)}$ and for obtaining difference and borrow signals and testing the borrow signals; means responsive to the borrow signal assuming a second value indicative of C' (sk)$<2^{-l(k)}$ for outputting the contents of the first counter means as a decoded symbol, for resetting (97) said first counter means, and for left shifting the register contents by l(k) bit positions; and means (75. 17) for inserting the next r-bit segment of codestring C' (sk) into the r lowest ordered bit positions of the shift register.

10. An apparatus according to claim 9, wherein said apparatus further comprises:

a second (103), a third (105), and a fourth (123) counter;

means (77) for ascertaining the bit value of a predetermined bit position (msb, 73) in the shift register, for respectively incrementing the second counter by +1 if the second counter value is less than n and the ascertained bit value is correspondingly 1 and resetting said second counter to 0 if the ascertained bit value is 0, and for left shifting the shift register contents by 1 bit position, and for adding 1 (91, 93, 89) to the least significant bit position of the n highest order bit positions in the shift register if the contents of the second counting are equal to the value n and the value in the ascertained shift register bit position is 1, said means left shifting the r lowest order bit positions by 1 and resetting the second counter means;

means (75, 5, 17) including the control unit subsequent to second counter modification for inserting an r-bit segment of the codestring C' (sk) in the lowest order r-bit positions of the shift register if the third counter means is equal to a predetermined value, for resetting said third counter concurrent with loading, and for incrementing third counter if its contents are less than the predetermined value; and means (127, 129) including the control unit for ascertaining whether the contents of the l(k) highest order bit positions of the r lowest order bit positions of the shift register have completed the recursive bit test and shift operations, if l(k) recursions have been completed then the decoder is enabled for generating the next symbol k, if not the recursion is continued.

* * * * *